United States Patent
Ji et al.

(10) Patent No.: US 11,647,646 B2
(45) Date of Patent: May 9, 2023

(54) METHOD FOR ENCAPSULATING OPENINGS IN DISPLAY AREA, ENCAPSULATION STRUCTURE OF OPENINGS IN DISPLAY AREA AND DISPLAY PANEL

(71) Applicants: Chengdu BOE Optoelectronics Technology Co., Ltd., Chengdu (CN); BOE TECHNOLOGY GROUP CO., LTD., Beijing (CN)

(72) Inventors: Yufei Ji, Beijing (CN); Dong Yang, Beijing (CN); Jiahao Xu, Beijing (CN); Jianglin Wang, Beijing (CN); Dongliang Lu, Beijing (CN); Liang Song, Beijing (CN); Hao Cheng, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 216 days.

(21) Appl. No.: 16/765,270

(22) PCT Filed: Dec. 19, 2019

(86) PCT No.: PCT/CN2019/126611
§ 371 (c)(1),
(2) Date: May 19, 2020

(87) PCT Pub. No.: WO2020/143421
PCT Pub. Date: Jul. 16, 2020

(65) Prior Publication Data
US 2021/0226163 A1    Jul. 22, 2021

(30) Foreign Application Priority Data
Jan. 8, 2019   (CN) .......................... 201910015728.4

(51) Int. Cl.
*H01L 51/52*     (2006.01)

(52) U.S. Cl.
CPC ........... *H10K 50/844* (2023.02); *H10K 71/00* (2023.02)

(58) Field of Classification Search
CPC ..... H01L 51/52; H01L 27/32; H01L 51/5253; H01L 51/56; H01L 27/3234
See application file for complete search history.

(56) References Cited

U.S. PATENT DOCUMENTS

| | | |
|---|---|---|
| 10,199,448 B2 | 2/2019 | Kim et al. |
| 10,205,122 B2 | 2/2019 | Choi et al. |

(Continued)

FOREIGN PATENT DOCUMENTS

| | | |
|---|---|---|
| CN | 106409867 A | 2/2017 |
| CN | 106887523 A | 6/2017 |

(Continued)

OTHER PUBLICATIONS

International Search Report and Written Opinion dated Mar. 25, 2020 for PCT Patent Application No. PCT/CN2019/126611.

(Continued)

*Primary Examiner* — Caridad Everhart
(74) *Attorney, Agent, or Firm* — Perilla Knox & Hildebrandt LLP; Kenneth A. Knox (57) ABSTRACT

A method for encapsulating openings in a display area includes: forming an intermediate layer having an isolation hole and an assembly via on a substrate, the isolation hole dividing the intermediate layer into separate display portion and isolation portion and the assembly via being spaced apart from the isolation hole by the isolation portion; forming a groove on a side of the isolation portion facing the display portion and/or on a side of the isolation portion away from the display portion; forming a light emitting layer (Continued)

including a first light emitting portion, a second light emitting portion, a third light emitting portion, and a fourth light emitting portion, wherein the third light emitting portion is separate from at least one of the second light emitting portion and the fourth light emitting portion; and forming an encapsulation layer that covers the light emitting layer and the isolation portion, and is filled in a groove.

14 Claims, 5 Drawing Sheets

(56) References Cited

U.S. PATENT DOCUMENTS

| | | | |
|---|---|---|---|
| 10,535,725 B2 | 1/2020 | Kim et al. | |
| 2007/0108899 A1* | 5/2007 | Jung | H01L 51/5203 |
| | | | 313/506 |
| 2015/0179876 A1* | 6/2015 | Hu | H01L 33/20 |
| | | | 257/13 |
| 2017/0148856 A1 | 5/2017 | Choi et al. | |
| 2017/0373129 A1 | 12/2017 | Kim et al. | |
| 2019/0157373 A1 | 5/2019 | Kim et al. | |
| 2020/0006701 A1* | 1/2020 | Lee | H01L 27/3258 |
| 2020/0020752 A1 | 1/2020 | Shi et al. | |
| 2020/0035951 A1* | 1/2020 | Cheon | H01L 51/5096 |
| 2020/0066815 A1* | 2/2020 | Choi | H01L 27/3283 |
| 2020/0144535 A1* | 5/2020 | Kim | H01L 51/5256 |
| 2020/0212140 A1* | 7/2020 | Huh | H01L 51/5256 |
| 2021/0135150 A1* | 5/2021 | Wang | H01L 51/52 |

FOREIGN PATENT DOCUMENTS

| | | |
|---|---|---|
| CN | 107452894 A | 12/2017 |
| CN | 107546245 A | 1/2018 |
| CN | 107579171 A | 1/2018 |
| CN | 108574054 A | 9/2018 |
| CN | 108666347 A | 10/2018 |
| CN | 109742264 A | 5/2019 |
| JP | 2010014475 A | 1/2010 |
| JP | 5151739 B2 | 2/2013 |
| WO | 2019200862 A1 | 10/2019 |

OTHER PUBLICATIONS

1st Office Action dated Jan. 19, 2020 for Chinese Patent Application No. 201910015728.4.

* cited by examiner

METHOD FOR ENCAPSULATING OPENINGS IN DISPLAY AREA, ENCAPSULATION STRUCTURE OF OPENINGS IN DISPLAY AREA AND DISPLAY PANEL

CROSS REFERENCE TO RELATED APPLICATIONS

The present disclosure is a § 371 national phase application based on International Application No. PCT/CN2019/126611, filed on Dec. 19, 2019, which is based upon and claims priority to Chinese Patent Application No. 201910015728.4, filed on Jan. 8, 2019, the entire contents of which are incorporated herein by reference.

TECHNICAL FIELD

The present disclosure relates to display technology and, more particularly, to a method for encapsulating openings in a display area, an encapsulation structure of openings in a display area, and a display panel.

BACKGROUND

Organic Light Emitting Display (OLED) panels have gradually become the first choice for screens. They have many advantages, such as self-illumination, high luminous efficiency, short response time, high definition and contrast, and also ensure the flexibility and adaptability of the screens.

With the increasing demand for a large screen-to-body ratio at present, full screen and narrow bezel features have become the mainstream of current design. Therefore, it is necessary to punch a hole in a light emitting area of the screen and then mount a camera, a sensor, and so forth therein, which undoubtedly has a stronger visual impact of "full screen". Moreover, it is necessary to build components, such as an axis, in the center of an electronic device, such as a watch. Thus, punching a hole in a display area has undoubtedly become the mainstream of next-generation "full screen" design.

It should be noted that information disclosed in this part are provided only for acquiring a better understanding of the background of the present application and therefore, may include information that is not current technology already known to those of ordinary skill in the art.

SUMMARY

The object of the present disclosure is to provide a method for encapsulating openings in a display area, an encapsulation structure of openings in a display area, and a display panel.

A first aspect of the present disclosure provides a method for encapsulating openings in a display area, comprising:

forming an intermediate layer having an isolation hole and an assembly via on a substrate, the isolation hole dividing the intermediate layer into separate display portion and isolation portion and the assembly via being spaced apart from the isolation hole by the isolation portion;

forming a groove on a side of the isolation portion facing the display portion and/or on a side of the isolation portion away from the display portion;

forming a light emitting layer, the light emitting layer comprising a first light emitting portion formed on the display portion, a third light emitting portion formed on the top of the isolation portion and a second light emitting portion and a fourth light emitting portion both formed on the substrate and located in the isolation hole and the assembly via respectively, and wherein the third light emitting portion is separate from at least one of the second light emitting portion and the fourth light emitting portion; and forming an encapsulation layer, the encapsulation layer covering the light emitting layer and the isolation portion, and being filled in a groove.

In an example embodiment of the present disclosure, the isolation portion comprises an inorganic layer and an organic layer on the inorganic layer.

In an example embodiment of the present disclosure, forming the groove on the side of the isolation portion facing the display portion and/or on the side of the isolation portion away from the display portion comprises:

etching a side on the inorganic layer of the isolation portion facing the display portion and/or a side on the inorganic layer of the isolation portion away from the display portion by using an inorganic etching solution to form the groove.

In an example embodiment of the present disclosure, the inorganic etching solution is hydrofluoric acid.

In an example embodiment of the present disclosure, before forming the groove on the side of the isolation portion facing the display portion and/or on the side of the isolation portion away from the display portion, the method further comprises:

forming a protective layer on the display portion.

In an example embodiment of the present disclosure, the protective layer is made of photoresist.

In an example embodiment of the present disclosure, forming the groove on the side of the isolation portion facing the display portion and/or on the side of the isolation portion away from the display portion specifically comprises:

forming a groove on both the side of the isolation portion facing the display portion and/or on the side of the isolation portion away from the display portion.

In an example embodiment of the present disclosure, the inorganic layer is provided in multiple layers and the isolation portion further comprises a metal layer, the metal layer being located between the adjacent inorganic layers A second aspect of the present disclosure provides an encapsulation structure of openings in a display area, comprising:

a substrate;

an intermediate layer formed on the substrate, the intermediate layer having an isolation hole and an assembly via, the isolation hole dividing the intermediate layer into separate display portion and isolation portion and the assembly via being spaced apart from the isolation hole by the isolation portion, a groove being provided on a side of the isolation portion facing the display portion and/or on a side of the isolation portion away from the display portion;

a light emitting layer, comprising a first light emitting portion, a second light emitting portion, a third light emitting portion and a fourth light emitting portion that are separate from one another, the first light emitting portion being formed on a light emitting area of the display portion, the second light emitting portion and the fourth light emitting portion being formed on the substrate and located in the isolation hole and the assembly via respectively, the third light emitting portion being formed on the top of the isolation portion; and an encapsulation layer, the encapsulation layer covering the light emitting layer and the isolation portion, and being filled in a groove.

A third aspect of the present disclosure provides a display panel, comprising the above-mentioned encapsulation structure of openings in a display area.

It is to be understood that both the foregoing general description and the following detailed description are explanatory only and are not restrictive of the invention, as claimed.

BRIEF DESCRIPTION OF THE DRAWINGS

The accompanying drawings, which are incorporated in and constitute part of this specification, illustrate embodiments consistent with the invention and, together with the description, serve to explain the principles of the invention. Understandably, the drawings in the following description are only for illustrating some embodiments of the present disclosure and those of ordinary skill in the art can also derive other drawings based on the drawings without paying any creative labor.

DETAILED DESCRIPTION

Example embodiments will now be described more fully by reference to the accompanying drawings. However, the example embodiments can be implemented in various forms and should not be understood as being limited to the examples set forth herein; rather, the embodiments are provided so that this disclosure will be thorough and complete, and the conception of example embodiments will be fully conveyed to those skilled in the art. The same reference signs in the drawings denote the same or similar structures and detailed description thereof will be omitted.

Although terms having opposite meanings such as "up" and "down" are used herein to describe the relationship of one component relative to another component, such terms are used herein only for the sake of convenience, for example, "in the direction illustrated in the figure". It can be understood that if a device denoted in the drawings is turned upside down, a component described as "above" something will become a component described as "under" something. When a structure is described as "above" another structure, it probably means that the structure is integrally formed on another structure, or, the structure is "directly" disposed on another structure, or, the structure is "indirectly" disposed on another structure through an additional structure.

Words such as "one", "an/a", "the", and "said" are used herein to indicate the presence of one or more elements/component parts/and others. Terms "including", and "having" have an inclusive meaning which means that there may be additional elements/component parts/and others in addition to the listed elements/component parts/and others. Terms "first", "second", "third", and "fourth" are used herein only as markers, and they do not limit the number of objects modified after them.

Organic Light Emitting Display (OLED) panels have gradually become the first choice for screens. They have many advantages such as self-illumination, high luminous efficiency, short response time, high definition and contrast, and also ensure the flexibility and adaptability of the screens.

With the increasing demand for a large screen-to-body ratio, full screen and narrow bezel features have become the mainstream of current design. Therefore, it is necessary to punch a hole in a light emitting area of the screen and then mount a camera, a sensor, and so forth therein, which undoubtedly has a stronger visual impact of a "full screen". Moreover, it is necessary to build components, such as an axis, in the center of an electronic device, such as a watch. Thus, punching a hole in the display area has undoubtedly become the mainstream of the next-generation "full screen" design. However, during the punching, it is easy to expose an organic material of a light emitting layer. As such, moisture and oxygen in the air easily enter and are diffused into the display area from the exposed light emitting layer, so that there is a Growing Black Spots (GDS) phenomenon occurring on the display area, which seriously affects the yield and quality of a display panel.

Figure 1:
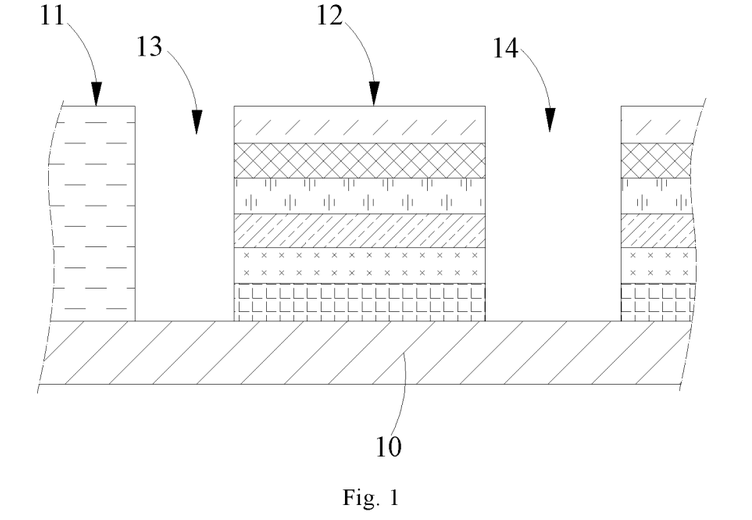
FIG. 1 is a partial structural diagram of the encapsulation structure of openings after step S100 or S400 is completed.
Figure 2:
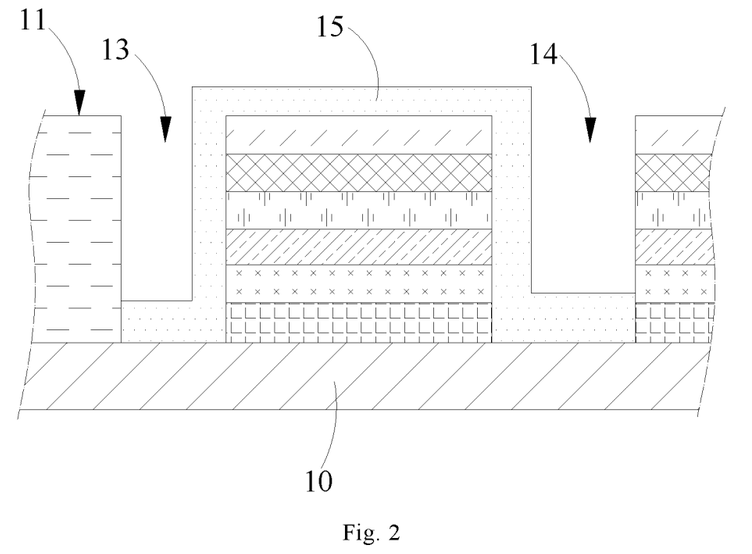
FIG. 2 is a partial structural diagram of the encapsulation structure of openings after step S200 is completed.
Figure 3:
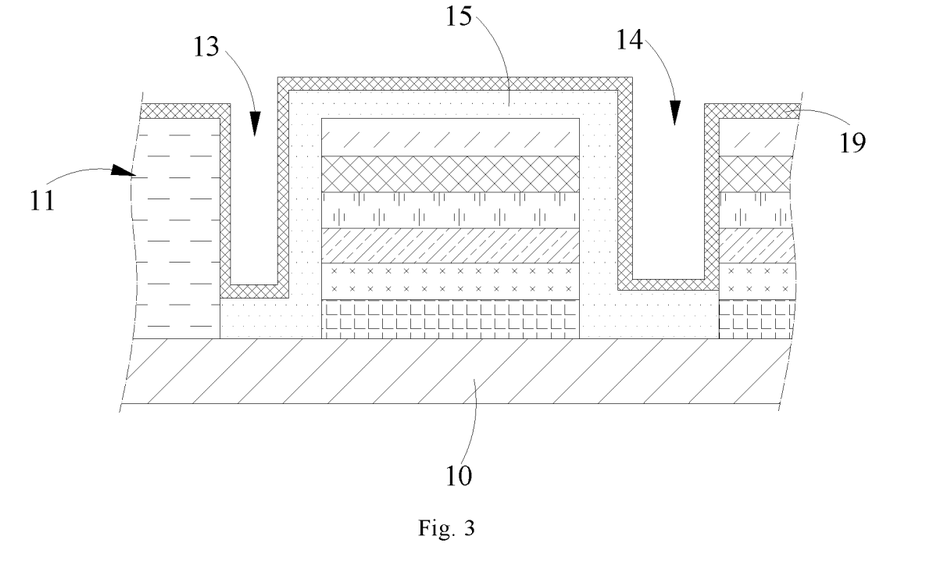
FIG. 3 is a partial structural diagram of the encapsulation structure of openings after step S300 is completed.
Figure 9:
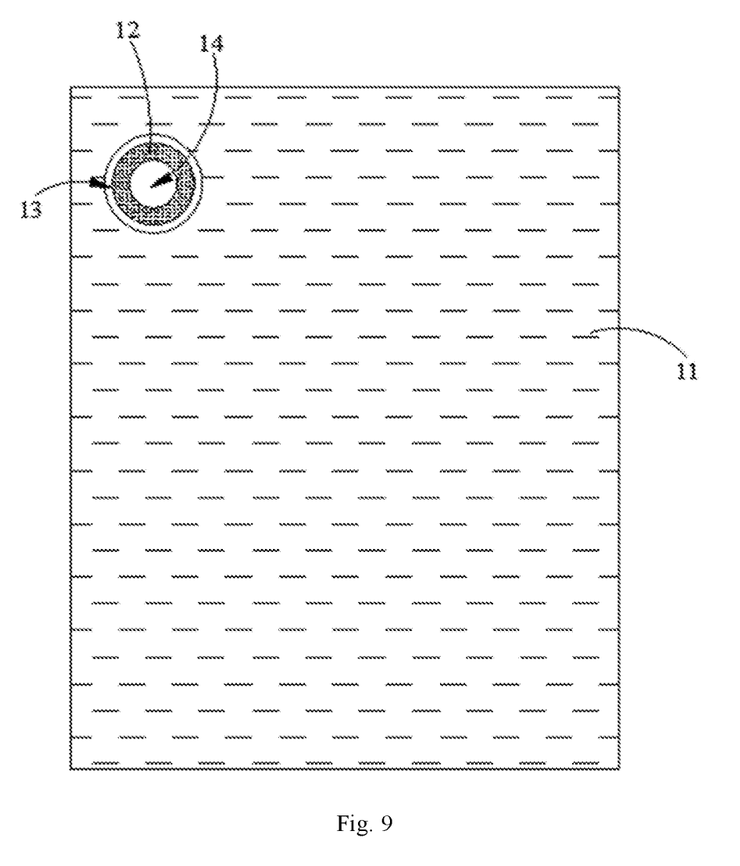
FIG. 9 is a plan view of the encapsulation structure of openings after step S100 or S400 is completed.

In the relevant technology, encapsulation will be required before the display area is punched. Specifically, a method for encapsulating openings in a display area may include, in step S100, forming an intermediate layer having an isolation hole 13 and an assembly via 14 (the assembly via 14 is located in a punching area) on a substrate 10. The isolation hole 13 divides the intermediate layer into a display portion 11 and an isolation portion 12 that are separated, and the assembly via 14 is spaced apart from the isolation hole 13 by the isolation portion 12, as shown in FIGS. 1 and 9. Next, in step 200, a luminescent material is evaporated. During the evaporation of the luminescent material, in addition to the luminescent material being evaporated on a light emitting area of the display portion 11, the luminescent material may also be evaporated on portions on the substrate 10 corresponding to the assembly via 14 and the isolation hole 13 and on the isolation portion 12. As shown in FIG. 2, the isolation portion 12 and the portions on the substrate 10 corresponding to the assembly via 14 and the isolation hole 13 are completely covered with a light emitting layer 15, which is an entire layer of continuous structure. Thereafter, in step 300, an encapsulation layer 19 covering the light emitting layer 15 is formed, as shown in FIG. 3.

However, when a hole is punched in an area corresponding to the assembly via 14, a portion of the light emitting layer 15 located at the assembly via 14 is easily exposed. As shown in FIG. 2, since the light emitting layer 15 is an entire layer of continuous structure, moisture, oxygen, and so on in the air easily enter and are diffused the display portion 11 from the exposed light emitting layer 15, leading to the GDS phenomenon on the display portion 11, which seriously affects the yield and quality of the display panel.

Figure 4:
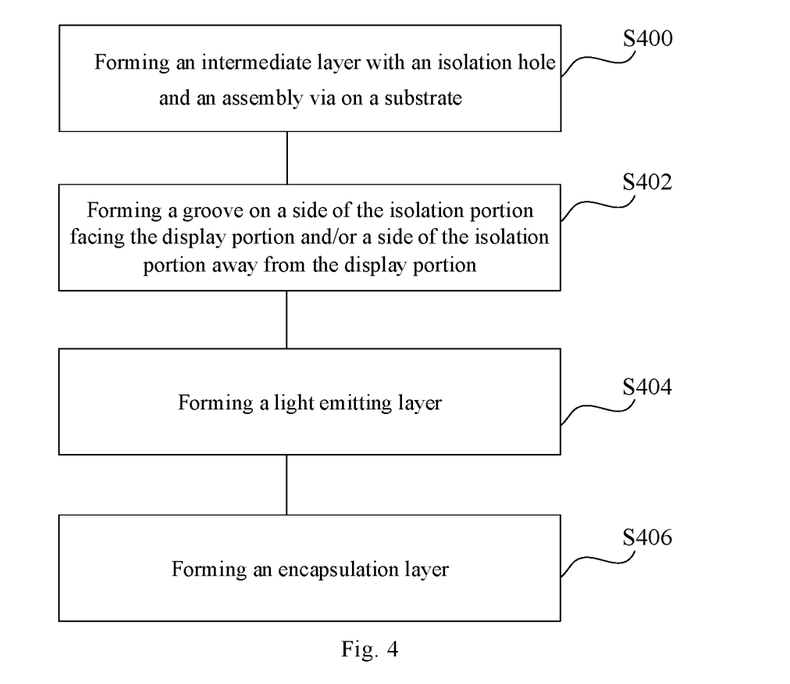
FIG. 4 is a flowchart of a method for encapsulating openings in a display area according to some embodiments of the present disclosure.

In order to solve the above-mentioned technical problem, an embodiment of the present disclosure provides a method for encapsulating openings in a display area. As shown in FIG. 4, the method includes the following steps:

In step S400, an intermediate layer with an isolation hole and an assembly via is formed on a substrate. The isolation hole divides the intermediate layer into a separate display portion and isolation portion, and the assembly via is spaced apart from the isolation hole by the isolation portion.

In step S402, a groove is formed on a side of the isolation portion facing the display portion and/or a side of the isolation portion away from the display portion.

In step S404, a light emitting layer is formed. The light emitting layer includes a first light emitting portion formed on the display portion, a third light emitting portion formed on the top of the isolation portion, and second and fourth light emitting portions which are formed on the substrate and are respectively located in the isolation hole and the assembly via. The third light emitting portion is separate from at least one of the second light emitting portion and the fourth light emitting portion.

In step S406, an encapsulation layer is formed, which covers the light emitting layer and the isolation portion, and which is filled in the groove.

In the embodiment, the groove is formed on the side of the isolation portion facing the display portion and/or the side of the isolation portion away from the display portion, so that the subsequently formed light emitting layer is a disconnected structure. That is, the third light emitting portion formed on the top of the isolation portion is separate from at least one of the second and fourth light emitting portions formed on the substrate. Thereafter, the encapsulation layer is formed. By doing so, even if the fourth light emitting portion at the assembly via is exposed when a hole is subsequently punched in the portion corresponding to the assembly via, since the third light emitting portion is separate from at least one of the second and fourth light emitting portions, a breakage between the third light emitting portion and at least one of the second light emitting portion and the fourth light emitting portion can block moisture or oxygen in the air from entering and being diffused into the display portion from the exposed fourth light emitting portion. Thereby, the GDS phenomenon in which black spots are growing on the display portion is avoided, the yield and quality of the display panel are improved, and the service life of the display panel is extended.

The method for encapsulating openings in a display area in embodiments of the present disclosure will be described in detail below with reference to the accompanying drawings.

In step S400, an intermediate layer having an isolation hole 13 and an assembly via 14 is formed on a substrate 10. The isolation hole 13 divides the intermediate layer into separate display portion 11 and isolation portion 12 and the assembly via 14 is spaced apart from the isolation hole 13 by the isolation portion 12, as shown in FIGS. 1 and 9.

In detail, as shown in FIGS. 1 and 5 to 8, forming the intermediate layer having the isolation hole 13 and the assembly hole on the substrate 10 may specifically include forming an intermediate layer on the substrate 10. The substrate 10 may be a flexible substrate, but it is not limited thereto. Moreover, the flexible substrate may be made of Polyimide (PI), but it is not limited thereto. An isolation hole 13 and an assembly via 14 penetrating through the intermediate layer are then formed. The isolation hole 13 and the assembly via 14 may be simultaneously formed to reduce processing steps and improve the manufacturing efficiency, but it is not limited thereto. The isolation hole 13 and the assembly via 14 may also be formed in steps. The intermediate layer may be divided into two separate portions by forming the isolation hole 13 penetrating through the intermediate layer. One of the two portions is used for normal display, and may be called the display portion 11; and the other one is used for isolation and encapsulation rather than display, and may be called the isolation portion 12. The assembly via 14 is spaced apart from the isolation hole 13 by the isolation portion 12. Specifically, the assembly via 14 corresponds to a punching area on the substrate 10 that needs to be perforated. Further, the assembly via 14 has a larger area than that of the punching area so as to avoid exposing the third light emitting portion 17 on the isolation portion 12 during the punching.

It should be noted that the isolation portion 12 is in a ring shape, and may have a circular ring structure, a square ring structure, or a special-shaped ring structure. Moreover, one or more isolation portions 12 may be provided. When the isolation portion 12 is in a ring shape, the assembly hole may be located in an annular closed hole of the isolation portion 12.

Figure 5:
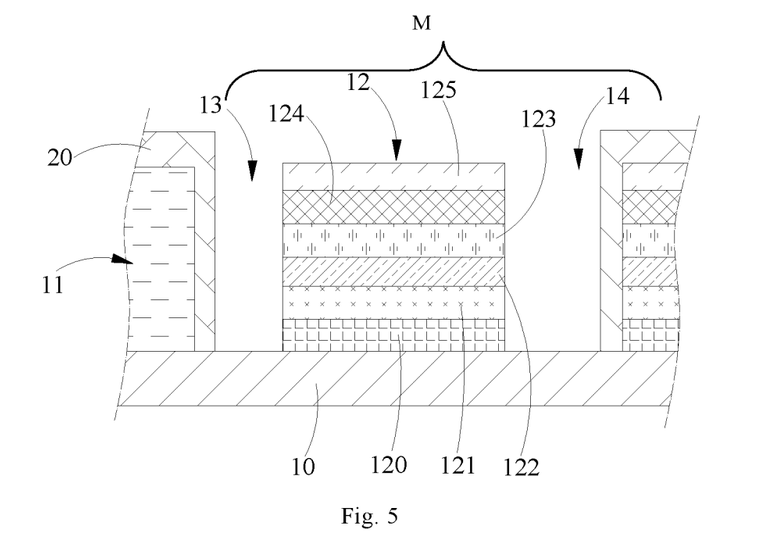
FIG. 5 is a partial structural diagram of the encapsulation structure of openings after step S401 is completed.

For example, the aforementioned intermediate layer may refer to a layer formed before the display panel is completed. The intermediate layer may be a multilayer structure. Specifically, the intermediate layer may include an inorganic layer and an organic layer on the inorganic layer, wherein the organic layer may be located on the top of the intermediate layer. The organic layer may be a planarization layer 125 in the display panel. The planarization layer 125 may be made of PI material. The inorganic layer may be provided in multiple layers and the inorganic layers may be made of the same inorganic material or different inorganic materials. The inorganic layers may be a buffer layer 120, a gate insulating layer and a dielectric layer 124 in the display panel. In addition, the intermediate layer may further include a metal layer. The metal layer may be a gate layer 123 in the display panel. The gate layer 123 may be made of Molybdenum (Mo). The metal layer may be located between the adjacent inorganic layers. As shown in FIG. 5, an intermediate layer M may include an isolation hole 13, an assembly via 14 and an isolation portion 12.

In view of the above, in one embodiment, as shown in FIGS. 5-8, the isolation portion 12 of the intermediate layer may include a buffer layer 120, a first gate insulating layer 121, a second gate insulating layer, a gate layer 123, a dielectric layer 124, and a planarization layer 125 formed on a substrate 10 in sequence, but it is not limited thereto.

Figure 6:
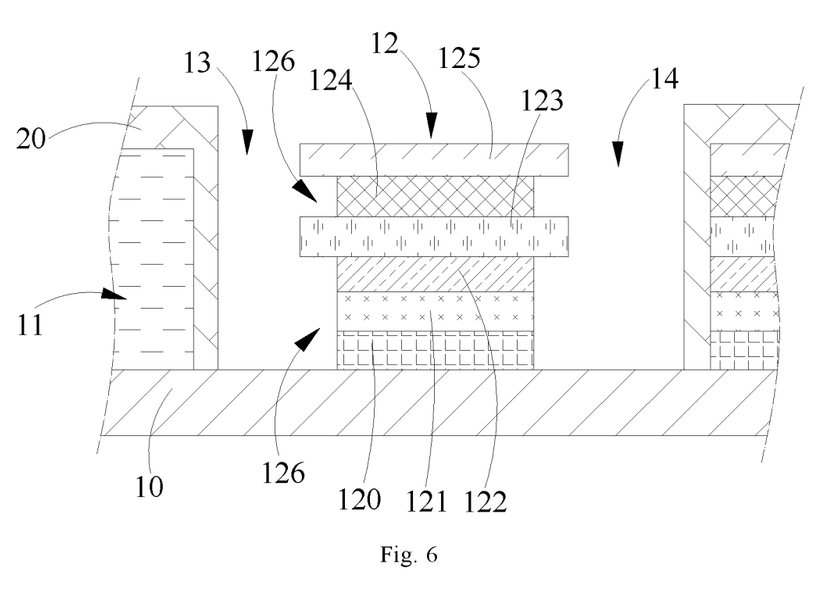
FIG. 6 is a partial structural diagram of the encapsulation structure of openings after step S402 is completed.

In step S402, a groove 126 is formed on a side of the isolation portion 12 facing the display portion 11 and/or on a side of the isolation portion 12 away from the display portion 11, as shown in FIG. 6.

In some embodiments or alternatively, a groove 126 is formed on both the side of the isolation portion 12 facing the display portion 11 and/or on the side of the isolation portion 12 away from the display portion 11. The groove 126 makes the sides of the isolation portion uneven, so it is difficult to form a continuous luminescent material on the sides of the isolation portion during the subsequent evaporation of the luminescent material. That is to say, the luminescent material is discontinuous, so that a third light emitting portion 17 is separate from a second light emitting portion 16 and a fourth light emitting portion 18, respectively. Even if the fourth light emitting portion 18 at the assembly via 14 is exposed during subsequent punching, since the third light emitting portion 17 is separate from both the second light emitting portion 16 and the fourth light emitting portion 18, breakages between the third light emitting portion 17 and the second light emitting portion 16 as well as between the third light emitting portion 17 and the fourth light emitting portion 18 can block moisture or oxygen in the air from entering and being diffused into the display portion 11 from the exposed fourth light emitting portion 18. Thus, the GDS phenomenon in which black spots are growing on the display portion 11 is avoided, the yield and quality of the display panel are improved and the service life of the display panel is extended.

It should be noted that, when the isolation portion 12 is in a ring shape, the side of the isolation portion 12 facing the display portion 11 is an outer ring surface of the isolation portion 12 and the side of the isolation portion 12 away from the display portion 11 is an inner ring surface of the isolation portion 12.

As mentioned above, the intermediate layer may include an inorganic layer and an organic layer on the inorganic layer. Since the isolation portion 12 is part of the intermediate layer, the isolation portion 12 may generally also include an inorganic layer and an organic layer. When the isolation portion 12 includes the inorganic layer and the organic layer, the sides of the isolation portion 12 may be etched by adopting a wet etching method to form the groove 126. For example, step S402 may include etching the side on the inorganic layer of the isolation portion 12 facing the display portion 11 and/or the side on the inorganic layer of the isolation portion 12 away from the display portion 11 by using an inorganic etching solution to form the groove 126. The inorganic etching solution may be hydrofluoric acid, but it is not limited thereto.

It should be noted that the inorganic etching solution is only used for etching the inorganic layer, cannot be used for etching the metal layer and the organic layer.

In addition, as mentioned earlier, the inorganic layer in the intermediate layer may be provided in multiple layers. The intermediate layer may further include a metal layer, which may be located between adjacent inorganic layers. Since the isolation portion 12 is a portion of the intermediate layer, the inorganic layer in the isolation portion 12 may also be provided in multiple layers. The isolation portion 12 may further include a metal layer between the adjacent inorganic layers. Since the metal layer and the organic layer cannot be etched by the inorganic etching solution, when the sides of the isolation portion 12 are etched by using the inorganic etching solution, a plurality of grooves 126 may be formed on the sides to more effectively avoid connections of the third light emitting portion 17 to the second light emitting portion 16 and the fourth light emitting portion 18 when a light emitting layer is formed. That is, it is ensured that the third light emitting portion 17 and at least one of the second light emitting portion 16 and the fourth light emitting portion 18 are in a broken state, to block moisture or oxygen in the air from entering and being diffused into the display portion 11 from the exposed fourth light emitting portion 18. Thus, the GDS phenomenon in which black spots are growing on the display portion 11 is avoided, the yield and quality of the display panel are improved and the service life of the display panel is extended.

In an embodiment, in order to avoid causing any damage to the display portion 11 during the formation of the grooves 126 and thus affecting the performance of the display portion 11, before forming the groove 126 on the side of the isolation portion 12 facing the display portion 11 and/or on the side of the isolation portion 12 away from the display portion 11, the method further includes step S401 of forming a protective layer 20 on the display portion 11, as shown in FIG. 5.

For example, the protective layer 20 may be photoresist. The photoresist is an organic material, and will not be etched, when the isolation portion 12 is etched using the inorganic etching solution to form the grooves 126.

It should be noted that the protective layer 20 may be formed not only on the display portion 11 but also on the isolation portion 12 where no groove 126 needs to be formed. That is, the protective layer 20 may be formed on a portion of the intermediate structure, in which no groove 126 needs to be formed.

Figure 7:
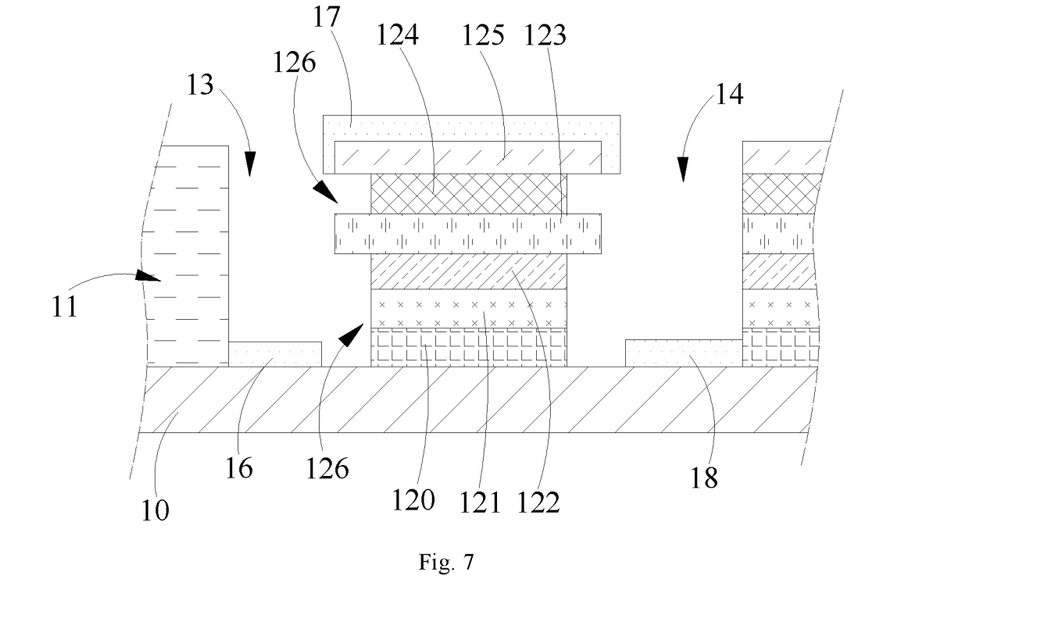
FIG. 7 is a partial structural diagram of the encapsulation structure of openings after step S404 is completed.

In step S404, a light emitting layer is formed. The light emitting layer may include a first light emitting portion (not shown) formed on the display portion 11, a third light emitting portion 17 formed on the top of the isolation portion 12 and a second light emitting portion 16 and a fourth light emitting portion 18 formed on the substrate 10 and located in the isolation hole 13 and the assembly via 14 respectively. The third light emitting portion 17 is separate from at least one of the second light emitting portion 16 and the fourth light emitting portion 18, as shown in FIG. 7.

For example, if the protective layer 20 is formed on the display portion 11 before the groove 126 is formed on the side of the isolation portion 12 facing the display portion 11 and/or on the side of the isolation portion 12 away from the display portion 11, the protective layer 20 may be first peeled off before the light emitting layer is formed and then the light emitting layer is formed by evaporation.

Figure 8:
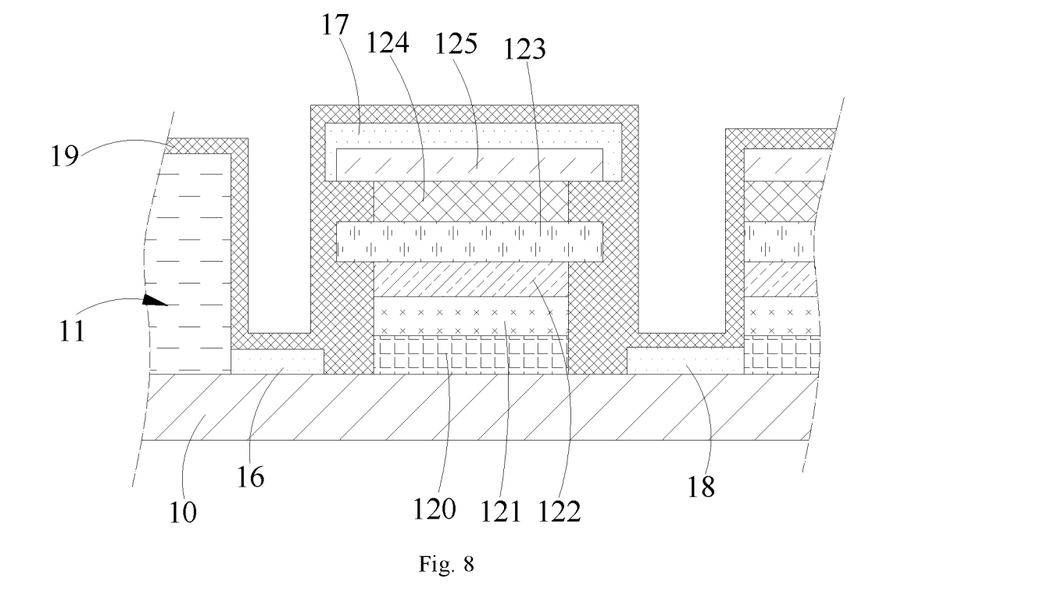
FIG. 8 is a partial structural diagram of the encapsulation structure of openings after step S406 is completed.

In step S406, an encapsulation layer 19 is formed. The encapsulation layer 19 covers the light emitting layer and the isolation portion 12, and is filled in the groove 126, as shown in FIG. 8.

For example, an encapsulation material may be deposited by adopting a Thin Film Encapsulation-Chemical Vapor Deposition (TFE-CVD) technology, to form the encapsulation layer 19, but it is not limited thereto. The encapsulation material may be silicon oxide (SiO), but it is not limited thereto, as long as the light emitting layer completely isolates moisture and oxygen.

Further, the present disclosure further provides an encapsulation structure of openings in a display area, which may be manufactured by using the aforementioned method for encapsulating openings in a display area. The encapsulation structure of openings in a display area includes a substrate 10, an intermediate layer, a light emitting layer and an encapsulation layer 19. The intermediate layer is formed on the substrate 10, and has an isolation hole 13 and an assembly via 14. The isolation hole 13 divides the intermediate layer into separate display portion 11 and isolation portion 12. The assembly via 14 is spaced apart from the isolation hole 13 by the isolation portion 12. A groove 126 is provided on a side of the isolation portion 12 facing the display portion 11 and/or a side of the isolation portion 12 away from the display portion 11. The light emitting layer includes a first light emitting portion, a second light emitting portion 16, a third light emitting portion 17 and a fourth light emitting portion 18 that are separate from one another. The first light emitting portion is formed in a light emitting area of the display portion 11. The second light emitting portion 16 and the fourth light emitting portion 18 are both formed on the substrate 10 and are located in the isolation hole 13 and the assembly via 14, respectively. The third light emitting portion 17 is formed on the top of the isolation portion 12. The encapsulation layer 19 covers the light emitting layer and the isolation portion 12, and is filled in the groove 126.

In addition, the present disclosure further provides a display panel including the encapsulation structure of openings in a display area described in the above embodiment.

Other embodiments of the invention will be apparent to those skilled in the art from consideration of the specification and practice of the invention disclosed here. This application is intended to cover any variations, uses, or adaptations of the invention following the general principles thereof and including such departures from the present disclosure as come within known or customary practice in the art. It is intended that the specification and examples be considered as exemplary only, with a true scope and spirit of the invention being indicated by the following claims.

What is claimed is:

1. A method for encapsulating openings in a display area, comprising:
forming an intermediate layer having an isolation hole and an assembly via on a substrate, the isolation hole dividing the intermediate layer into a display portion and an isolation portion separated from each other, and the assembly via being spaced apart from the isolation hole by the isolation portion, wherein the isolation portion is adapted for isolation and encapsulation rather than display and comprises a plurality of inorganic layers, a metal layer, and an organic layer stacked in a direction perpendicular to the substrate, the metal layer being located between adjacent inorganic layers, the organic layer being located on top of the plurality of inorganic layers, an orthographic projection of the assembly via on the substrate is within an orthographic projection of the isolation hole on the substrate, and a bottom of the isolation hole, a bottom of the assembly via, and a bottom of the isolation portion are disposed on a same level;
forming a groove on at least one of: a side of the isolation portion facing the display portion and a side of the isolation portion away from the display portion, wherein an opening direction of the groove is perpendicular to an opening direction of the isolation hole, and an orthographic projection of the groove on the substrate is within an orthographic projection of the isolation portion on the substrate;
forming a light emitting layer on a side of the intermediate layer away from the substrate, the light emitting layer being divided into a plurality of disconnected portions by at least one of the isolation hole and the assembly via, wherein the light emitting layer comprises at least a third light emitting portion which is a top layer of the isolation portion, and a fourth light emitting portion formed on the substrate and located in the assembly via; and
forming an encapsulation layer, the encapsulation layer covering the light emitting layer and the isolation portion and being filled in the groove.

2. The method for encapsulating openings in the display area according to claim 1, wherein:
the light emitting layer further comprises a first light emitting portion formed on the display portion, and a second light emitting portion formed on the substrate and located in the isolation hole; and
the third light emitting portion is separate from at least one of the second light emitting portion and the fourth light emitting portion.

3. The method for encapsulating openings in the display area according to claim 1, wherein forming the groove on at least one of the side of the isolation portion facing the display portion and the side of the isolation portion away from the display portion comprises:
etching at least one of a side on the inorganic layer of the isolation portion facing the display portion and a side on the inorganic layer of the isolation portion away from the display portion using an inorganic etching solution to form the groove.

4. The method for encapsulating openings in the display area according to claim 3, wherein the inorganic etching solution is hydrofluoric acid.

5. The method for encapsulating openings in the display area according to claim 1, wherein, before forming the groove on at least one of the side of the isolation portion facing the display portion and the side of the isolation portion away from the display portion, the method further comprises forming a protective layer on the display portion.

6. The method for encapsulating openings in the display area according to claim 5, wherein the protective layer is made of a photoresist.

7. The method for encapsulating openings in the display area according to claim 1, wherein forming the groove on at least one of the side of the isolation portion facing the display portion and the side of the isolation portion away from the display portion specifically comprises forming a groove on both the side of the isolation portion facing the display portion and the side of the isolation portion away from the display portion.

8. The method for encapsulating openings in the display area according to claim 2, wherein forming the light emitting layer comprises:
evaporating a luminescent material on the isolation portion, the display portion, and an area on the substrate except for the isolation portion and the display portion, so that the luminescent material is discontinuously distributed due to the groove provided in the isolation portion to form the first light emitting portion, the second light emitting portion, the third light emitting portion, and the fourth light emitting portion.

9. An encapsulation structure of openings in a display area, comprising:
a substrate;
an intermediate layer located on the substrate, the intermediate layer having an isolation hole and an assembly via, the isolation hole dividing the intermediate layer into display portion and isolation portion separated from each other, and the assembly via being spaced apart from the isolation hole by the isolation portion, wherein the isolation portion is adapted for isolation and encapsulation rather than display and comprises a plurality of inorganic layers, a metal layer, and an organic layer stacked in a direction perpendicular to the substrate, the metal layer being located between adjacent inorganic layers, the organic layer being located on top of the plurality of inorganic layers, an orthographic projection of the assembly via on the substrate is within an orthographic projection of the isolation hole on the substrate, and a bottom of the isolation hole, a bottom of the assembly via, and a bottom of the isolation portion are disposed on a same level;
a groove formed on a side of the isolation portion facing the display portion and/or on a side of the isolation portion away from the display portion, wherein an opening direction of the groove is perpendicular to an opening direction of the isolation hole, and an orthographic projection of the groove on the substrate is within an orthographic projection of the isolation portion on the substrate;
a light emitting layer on a side of the intermediate layer away from the substrate, and disconnected at at least one of the isolation hole and the assembly via, wherein the light emitting layer comprises at least a third light emitting portion which is a top layer of the isolation portion, and a fourth light emitting portion formed on the substrate and located in the assembly via; and
an encapsulation layer covering the light emitting layer and the isolation portion and being filled in the groove.

10. The encapsulation structure of openings in the display area according to claim 9, wherein the light emitting layer comprises a first light emitting portion, a second light emitting portion, the third light emitting portion and the fourth light emitting portion that are separate from one another, the first light emitting portion being located on a side of the display portion away from the substrate, and the second light emitting portion being formed on the substrate and located in the isolation hole.

11. The encapsulation structure of openings in the display area according to claim 9, further comprising a protective layer on the display portion.

12. The encapsulation structure of openings in the display area according to claim 11, wherein the protective layer is made of photoresist.

13. The encapsulation structure of openings in the display area according to claim 9, wherein the metal layer comprises molybdenum.

14. A display panel comprising an encapsulation structure for encapsulating openings in a display area, the encapsulation structure comprising:
  a substrate;
  an intermediate layer located on the substrate, the intermediate layer having an isolation hole and an assembly via, the isolation hole dividing the intermediate layer into a display portion and an isolation portion separated from each other, and the assembly via being spaced apart from the isolation hole by the isolation portion, wherein the isolation portion is adapted for isolation and encapsulation rather than display and comprises a plurality of inorganic layers, a metal layer, and an organic layer stacked in a direction perpendicular to the substrate, the metal layer being located between adjacent inorganic layers, the organic layer being located on top of the plurality of inorganic layers, an orthographic projection of the assembly via on the substrate is within an orthographic projection of the isolation hole on the substrate, and a bottom of the isolation hole, a bottom of the assembly via, and a bottom of the isolation portion are disposed on a same level;
  a groove formed on a side of the isolation portion facing the display portion and/or on a side of the isolation portion away from the display portion, wherein an opening direction of the groove is perpendicular to an opening direction of the isolation hole, and an orthographic projection of the groove on the substrate is within an orthographic projection of the isolation portion on the substrate;
  a light emitting layer on a side of the intermediate layer away from the substrate, and being disconnected at at least one of: the isolation hole and the assembly via, wherein the light emitting layer comprises at least a third light emitting portion which is a top layer of the isolation portion, and a fourth light emitting portion formed on the substrate and located in the assembly via; and
  an encapsulation layer covering the light emitting layer and the isolation portion and being filled in the groove.

* * * * *